United States Patent
Shim et al.

(10) Patent No.: US 9,941,868 B1
(45) Date of Patent: Apr. 10, 2018

(54) BUFFER CIRCUIT, RECEIVER AND SYSTEM USING THE SAME

(71) Applicant: SK hynix Inc., Icheon-si, Gyeonggi-do (KR)

(72) Inventors: Jong Joo Shim, Icheon-si (KR); Jee Yeon Keh, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/988,030

(22) Filed: Jan. 5, 2016

(30) Foreign Application Priority Data

Aug. 31, 2015 (KR) .......................... 10-2015-0122961

(51) Int. Cl.
*G06G 7/12* (2006.01)
*H03K 5/02* (2006.01)
*H03K 5/04* (2006.01)

(52) U.S. Cl.
CPC .............. *H03K 5/023* (2013.01); *H03K 5/04* (2013.01)

(58) Field of Classification Search
None
See application file for complete search history.

(56) References Cited

U.S. PATENT DOCUMENTS

| 5,648,743 | A | * | 7/1997 | Nagaya | ..................... H03F 1/26 330/252 |
| 6,448,847 | B1 | * | 9/2002 | Paul | ..................... H03F 3/2171 327/563 |
| 7,023,272 | B2 | * | 4/2006 | Hung | ..................... H03F 1/223 330/126 |
| 8,847,683 | B2 | * | 9/2014 | Shirai | ................. H03F 3/45179 330/253 |
| 2012/0262236 | A1 | * | 10/2012 | Shirai | ................. H03F 3/45179 330/253 |
| 2012/0299758 | A1 | * | 11/2012 | Hwang | ............... H03M 1/1225 341/110 |
| 2013/0156079 | A1 | * | 6/2013 | Shih | ......................... H03F 3/45 375/221 |
| 2014/0253235 | A1 | * | 9/2014 | Fujii | ................... H03F 3/45197 330/254 |

FOREIGN PATENT DOCUMENTS

| KR | 1020030078334 A | 10/2003 |
| KR | 100780597 B1 | 11/2007 |

\* cited by examiner

*Primary Examiner* — Cassandra Cox
(74) *Attorney, Agent, or Firm* — William Park & Associates Ltd.

(57) ABSTRACT

A buffer circuit may include an amplification circuit, a main load circuit, and a sub-load circuit. The amplification circuit and the main load circuit may generate first and second output signals by amplifying first and second input signals. The sub-load circuit may compensate mismatch between rising timing and falling timing of the first output signal based on the first input signal.

20 Claims, 6 Drawing Sheets

BUFFER CIRCUIT, RECEIVER AND SYSTEM USING THE SAME

CROSS-REFERENCES TO RELATED APPLICATION

The present application claims priority under 35 U.S.C. § 119(a) to Korean application number 10-2015-0122961, filed on Aug. 31, 2015, in the Korean Intellectual Property Office, which is incorporated herein by reference in its entirety.

BACKGROUND

Technical Field

Various embodiments generally relate to a semiconductor apparatus, and more particularly, to a buffer circuit capable of receiving a signal, and a receiver and a system using the same.

Related Art

A personal electronic device such as a personal computer, a tablet PC, a laptop computer, and a smartphone may comprise various electronic elements. Two of the electronic elements in the electronic device may communicate with each other at a high speed in order to process a great deal of data in short time. Semiconductor apparatuses among the electronic elements exchange signals with each other thorough a transmitter and a receiver included therein.

The semiconductor apparatuses exchange signals with each other through a signal transmission line such as a bus electrically coupled thereto. As performance of the semiconductor apparatuses improves, a semiconductor apparatus capable of high speed operation with reduced power consumption is possible. Accordingly, levels or amplitudes of the signals transmitted through the bus become reduced. Therefore, there is a need for an improved receiver capable of precisely receiving signals transmitted through the signal transmission line.

DETAILED DESCRIPTION

Various embodiments may be provided to a buffer circuit capable of compensating mismatch between rising and falling timings of an output signal, and a semiconductor apparatus and a system using the same.

In an embodiment, a buffer circuit may be provided. The buffer circuit may include an amplification circuit configured to change voltage levels of first and second output nodes according to levels of first and second input signals. The buffer circuit may include a main load circuit configured to provide a power supply voltage to the first and second output nodes. The buffer circuit may include a sub-load circuit configured to provide the power supply voltage to the first output node in response to the first input signal.

In an embodiment, a buffer circuit may be provided. The buffer circuit may include an amplification circuit configured to change voltage levels of first and second output nodes according to levels of first and second input signals. The buffer circuit may include a main load circuit configured to provide a power supply voltage to the first and second output nodes. The buffer circuit may include a first sub-load circuit configured to provide the power supply voltage to the first output node in response to the first input signal. The buffer circuit may include a second sub-load circuit configured to provide the power supply voltage to the second output node in response to the second input signal.

In an embodiment, a buffer circuit may be provided. The buffer circuit may include an amplification circuit configured to change voltage levels of first and second output nodes according to levels of first and second input signals. The buffer circuit may include a main load circuit configured to provide a power supply voltage to the first and second output nodes. The buffer circuit may include a plurality of sub-load circuits configured to provide the power supply voltage to the first output node based on a plurality of selection signals and the first input signal.

Hereinafter, semiconductor apparatuses may be be described below with reference to the accompanying drawings through various embodiments.

Figure 1:
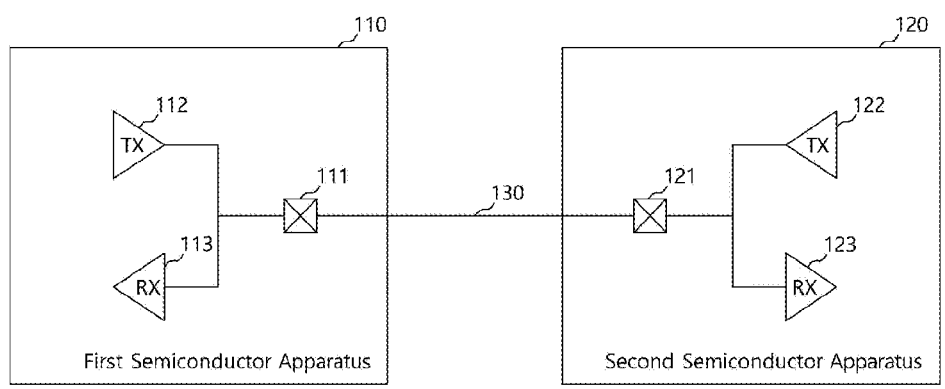
FIG. 1 is a block diagram illustrating a representation of an example of a system in accordance with an embodiment.

Referring to FIG. 1, a system 1 in accordance with an embodiment may include a first semiconductor apparatus 110 and a second semiconductor apparatus 120. The first semiconductor apparatus 110 and the second semiconductor apparatus 120 may be electronic elements communicating with each other. In an embodiment, the first semiconductor apparatus 110 may be a master apparatus and the second semiconductor apparatus 120 may be a slave apparatus performing various operations under the control of the first semiconductor apparatus 110. For example, the first semiconductor apparatus 110 may be a host apparatus such as a processor, and the processor may be one or more of the central processing unit (CPU), the graphic processing unit (GPU), the multi-media processor (MMP), the digital signal processor. The processor may be implemented in a form of the system on chip (SoC) by combining processor chips having various functions such as the application processor (AP). The second semiconductor apparatus 120 may be a memory. The memory may include the volatile memory device and the non-volatile memory. The volatile memory may include the static RAM (SRAM), the dynamic RAM (DARM), and the synchronous DRAM (SDRAM). The non-volatile memory may include the read only memory (ROM), the programmable ROM (PROM), the electrically erase and programmable ROM (EEPROM), the electrically programmable ROM (EPROM), the flash memory, the phase change RAM (PRAM), the magnetic RAM (MRAM), the resistive RAM (RRAM), and the ferroelectric RAM (FRAM).

The first and second semiconductor apparatuses 110 and 120 may be electrically coupled to each other through a signal transmission line 130. The first semiconductor apparatus 110 may include a pad 111, and the pad 111 may be electrically coupled to the signal transmission line 130. The second semiconductor apparatus 120 may include a pad 121, and the pad 121 may be electrically coupled to the signal transmission line 130. The signal transmission line 130 may be one of a channel, a link, and a bus. The first semiconductor apparatus 110 may include a transmitter 112 and a receiver 113. The transmitter 112 may generate an output signal according to an internal signal of the first semiconductor apparatus 110, and may transmit the output signal to the second semiconductor apparatus 120 through the signal transmission line 130. The receiver 113 may generate an internal signal by receiving a signal transmitted from the second semiconductor apparatus 120 through the signal transmission line 130. In the similar manner, the second semiconductor apparatus 120 may include a transmitter 122 and a receiver 123. The transmitter 122 may generate an output signal according to an internal signal of the second semiconductor apparatus 120, and may transmit the output signal to the first semiconductor apparatus 110 through the signal transmission line 130. The receiver 123 may generate an internal signal by receiving a signal transmitted from the first semiconductor apparatus 110 through the signal transmission line 130.

Figure 2:
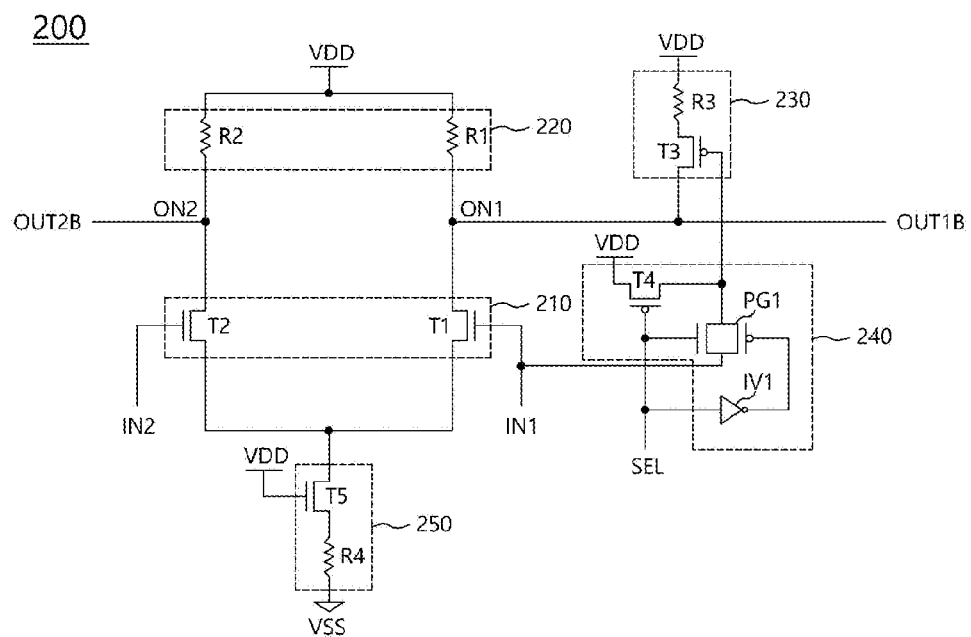
FIG. 2 is a circuit diagram illustrating a representation of an example of a buffer circuit in accordance with an embodiment.

FIG. 2 is a circuit diagram illustrating a representation of an example of a buffer circuit 200 in accordance with an embodiment. The buffer circuit 200 may be applicable to the receivers 113 and 123 of FIG. 1. Referring to FIG. 2, the buffer circuit 200 may include an amplification circuit 210, a main load circuit 220, and a sub-load circuit 230. The amplification circuit 210 may receive a first input signal IN1 and a second input signal IN2. The amplification circuit 210 may generate a first output signal OUT1B and a second output signal OUT2B by differentially amplifying the first and second input signals IN1 and IN2. The first output signal OUT1B may be output from a first output node ON1. The second output signal OUT2B may be output from a second output node ON2. The amplification circuit 210 may change voltage levels of the first and second output nodes ON1 and ON2 according to levels of the first and second input signals IN1 and IN2. The second input signal IN2 may be a differential signal of the first input signal IN1. Also, the second input signal IN2 may be a reference voltage signal. The reference voltage signal may have a voltage level corresponding a half of a voltage range, within which the first input signal IN1 swings.

The main load circuit 220 may provide a power supply voltage VDD to the amplification circuit 210. The main load circuit 220 may be electrically coupled to the amplification circuit 210 through the first and second output nodes ON1 and ON2. The main load circuit 220 may receive the power supply voltage VDD and provide the power supply voltage VDD to the first and second output nodes ON1 and ON2. The main load circuit 220 may provide the power supply voltage VDD to the first and second output nodes ON1 and ON2 and the amplification circuit 210 may change voltage levels of the first and second output nodes ON1 and ON2 according to levels of the first and second input signals IN1 and IN2, and therefore the first and second output signals OUT1B and OUT2B may be generated.

The sub-load circuit 230 may be electrically coupled to the first output node ON1. The sub-load circuit 230 may provide the power supply voltage VDD to the first output node ON1 in response to the first input signal IN1. The sub-load circuit 230 may provide the power supply voltage VDD to the first output node ON1 when the first input signal IN1 has a low level. The sub-load circuit 230 may provide the power supply voltage VDD to the first output node ON1 when the first output signal OUT1B rises from a low level to a high level. Therefore, the sub-load circuit 230 may make a rising slope of the first output signal OUT1B steeper.

Referring to FIG. 2, the buffer circuit 200 may further include a load switch circuit 240. The load switch circuit 240 may deactivate the sub-load circuit 230 in response to a selection signal SEL. The load switch circuit 240 may deactivate the sub-load circuit 230 by blocking input of the first input signal IN1 to the sub-load circuit 230 when the selection signal SEL is disabled.

The buffer circuit 200 may further include an enablement circuit 250. The enablement circuit 250 may form a current path of the amplification circuit 210 by receiving the power supply voltage VDD. The enablement circuit 250 may be electrically coupled between the amplification circuit 210 and a ground voltage VSS, and may form a current path from the amplification circuit 210 to the ground voltage VSS. FIG. 2 illustrates the enablement circuit 250 forming the current path by receiving the power supply voltage VDD, to which the present embodiments are not to be limited. The enablement circuit 250 may form the current path in response to any possible enable signal generated by a particular operation or during a particular mode. The enable signal may have a voltage level corresponding to the power supply voltage VDD.

Referring to FIG. 2, the amplification circuit 210 may include first and second transistors T1 and T2. Each of the first and second transistors T1 and T2 may be an N-channel MOS transistor. The first transistor T1 may receive the first input signal IN1 at its gate, may be electrically coupled to the first output node ON1 at its drain, and may be electrically coupled to the enablement circuit 250 at its source. The second transistor T2 may receive the second input signal IN2 at its gate, may be electrically coupled to the second output node ON2 at its drain, and may be electrically coupled to the enablement circuit 250 at its source. The first and second transistors T1 and T2 may change the voltage levels of the first and second output nodes ON1 and ON2 by changing an amount of current flowing through the first and second transistors T1 and T2 according to the levels of the first and second input signals IN1 and IN2.

The main load circuit 220 may include first and second resistive elements R1 and R2. Each of the first and second resistive elements R1 and R2 may be one of a passive resistive element and an active resistive element. The first resistive element R1 may receive the power supply voltage VDD at one end, and may be electrically coupled to the first output node ON1 at the other end. The second resistive element R2 may receive the power supply voltage VDD at one end, and may be electrically coupled to the second output node ON2 at the other end. In an embodiment, the first and second resistive elements R1 and R2 may have the same impedance value as each other or substantially the same impedance value as each other.

The sub-load circuit 230 may include a third transistor T3 and a third resistive element R3. The third transistor T3 may be a P-channel MOS transistor. The third transistor T3 may receive the first input signal IN1 at its gate, may be electrically coupled to the first output node ON1 at its drain, and may be electrically coupled to the third resistive element R3 at its source. The third resistive element R3 may receive the power supply voltage VDD at one end, and may be electrically coupled to the third transistor T3 at the other end. The third resistive element R3 may have various impedance values. For example, the third resistive element R3 may have the same impedance value as each of the first and second resistive elements R1 and R2, or may have a different impedance value from each of the first and second resistive elements R1 and R2 in order to adjust a waveform of the first output signal OUT1B.

The load switch circuit 240 may include a first inverter IV1, a first pass gate PG1 and a fourth transistor T4. The first inverter IV1 may invert the selection signal SEL. The first pass gate PG1 may receive the first input signal IN1. The first pass gate PG1 may selectively transfer the first input signal IN1 to the sub-load circuit 230 in response to the selection signal SEL and an output of the first inverter IV1 (i.e., the inverted signal of the selection signal SEL). For example, the first pass gate PG1 may transfer the first input signal IN1 to the sub-load circuit 230 when the selection signal SEL is enabled, and may not transfer the first input signal IN1 to the sub-load circuit 230 when the selection signal SEL is disabled. The first pass gate PG1 may deactivate the sub-load circuit 230 by blocking the input of the first input signal IN1 to the sub-load circuit 230 when the selection signal SEL is disabled. The fourth transistor T4 may be a P-channel MOS transistor. The fourth transistor T4 may receive the selection signal SEL at its gate, may be electrically coupled to the first pass gate PG1 at its drain, and may receive the power supply voltage VDD at its source. The fourth transistor T4 may hold the voltage level of an output node of the first pass gate PG1 to the power supply voltage VDD when the selection signal SEL is disabled. Therefore, the fourth transistor T4 may further deactivate the sub-load circuit 230 by turning off the third transistor T3 of the sub-load circuit 230.

The enablement circuit 250 may include a fifth transistor T5 and a fourth resistive element R4. The fifth transistor T5 may receive the power supply voltage VDD at its gate, may be electrically coupled to the amplification circuit 210 at its drain, and may be electrically coupled to the fourth resistive element R4 at its source. The fourth resistive element R4 may be electrically coupled to the fifth transistor T5 at one end, and may be electrically coupled to the ground voltage VSS at the other end. Therefore, the enablement circuit 250 may form the current path from the amplification circuit 210 to the ground voltage VSS.

Figure 3:
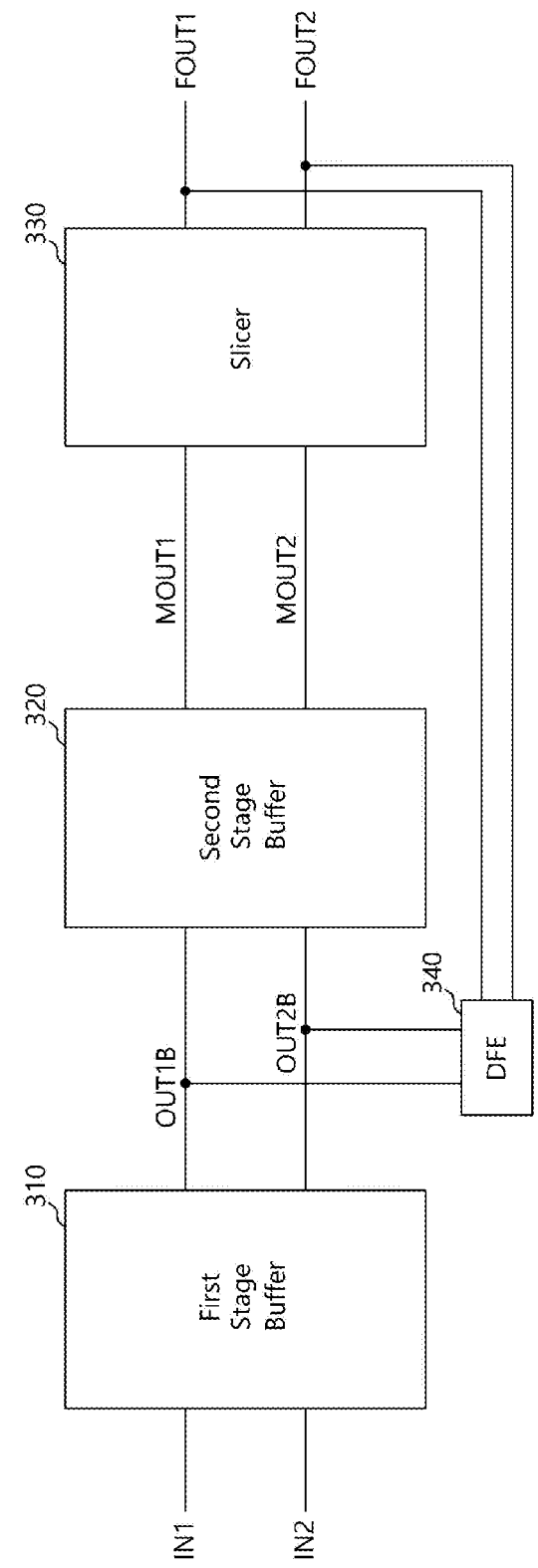
FIG. 3 is a block diagram illustrating a representation of an example of a receiver in accordance with an embodiment.

FIG. 3 is a block diagram illustrating representation of an example of a receiver 3 in accordance with an embodiment. Referring to FIG. 3, the receiver 3 may include a first stage buffer 310, a second stage buffer 320, a slicer 330, and an equalizer 340. The receiver 3 may precisely receive signals by amplifying input signals through plural stages of buffers. The first stage buffer 310 may generate the first and second output signals OUT1B and OUT2B by receiving the first and second input signals IN1 and IN2 and differentially amplifying the first and second input signals IN1 and IN2. The first stage buffer 310 may be implemented by the buffer circuit 200 described with reference to FIG. 2.

The second stage buffer 320 may generate first and second intermediate output signals MOUT1 and MOUT2 by differentially amplifying the first and second output signals OUT1B and OUT2B outputted form the first stage buffer 310. The slicer 330 may generate first and second final output signals FOUT1 and FOUT2 by buffering the first and second intermediate output signals MOUT1 and MOUT2. The equalizer 340 may be, for example, a decision feedback equalizer, and may receive the first and second final output signals FOUT1 and FOUT2. The receiver 3 may precisely receive signals because of the equalizer 340 correcting the first and second output signals OUT1B and OUT2B when an error occurs in the first and second final output signals FOUT1 and FOUT2.

FIG. 3 illustrates the receiver 3 including, for example, two stage buffers while the receiver 3 may include three or more stage buffers. When the receiver 3 includes a plurality of stage buffers, the first stage buffer 310 may have large capacitance at its output node.

Figure 4:
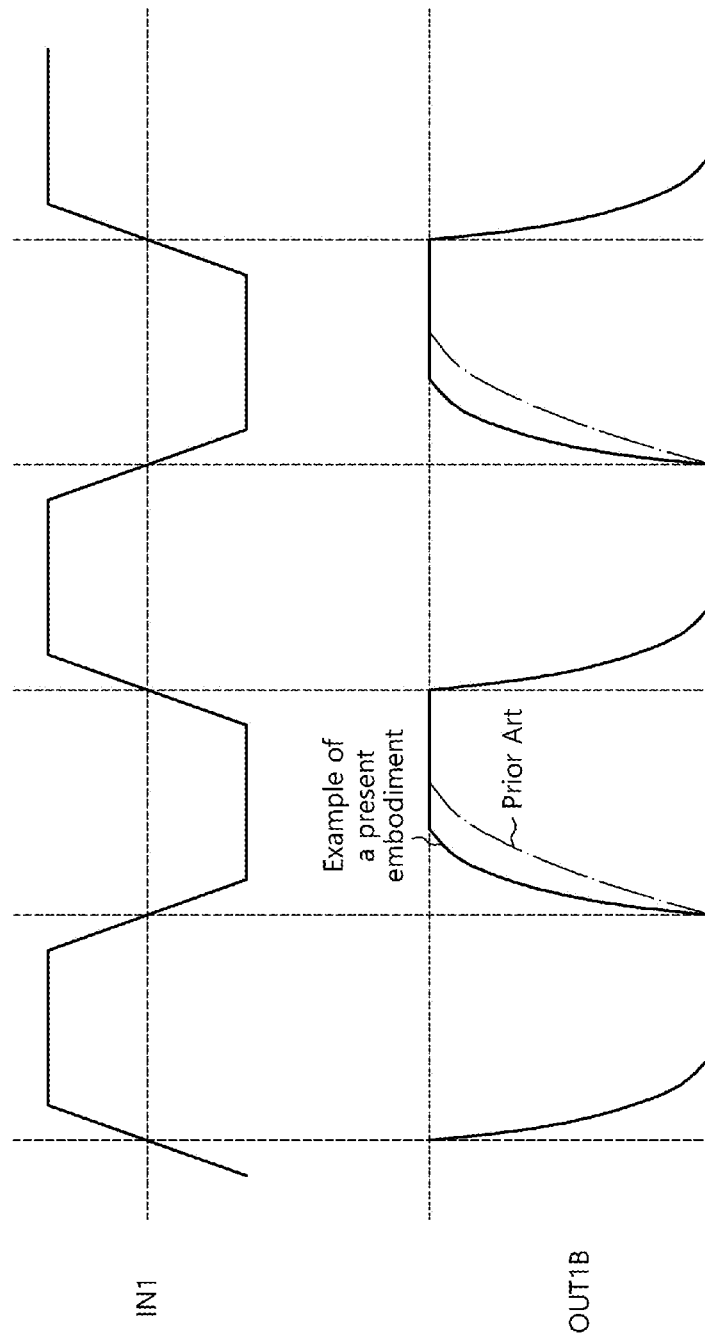
FIG. 4 is a timing diagram illustrating an operation of an existing buffer circuit and operations of examples of the buffer circuit of FIG. 2.

FIG. 4 is a timing diagram illustrating an operation of an existing buffer circuit and operations of examples of the buffer circuit 200 of FIG. 2. The buffer circuit 200 may generate the first output signal OUT1B according to the level of the first input signal IN1. The buffer circuit 200 may generate the first output signal OUT1B having a high level when the first input signal IN1 has a low level, and may generate the first output signal OUT1B having a low level when the first input signal IN1 has a high level. The first output signal OUT1B may change from a high level to a low level when the first input signal IN1 changes from a low level to a high level. Also, the first output signal OUT1B may change from a low level to a high level when the first input signal IN1 changes from a high level to a low level. According to the prior art without the sub-load circuit 230, the rising slope of the first output signal OUT1B may decrease due to the great capacitance of the first output node ON1. As the rising slope of the first output signal OUT1B decreases, level change timing of the first output signal OUT1B may become late and thus transition timing of the first output signal OUT1B may become late. Therefore, mismatch may occur between rising timing and falling timing of the first output signal OUT1B, which may cause reduced signal density of the first and second final output signals FOUT1 and FOUT2 of the receiver 3 of FIG. 3. In accordance with an embodiment, the sub-load circuit 230 may further drive the first output node ON1 when the first input signal IN1 has a low level. Therefore, the sub-load circuit 230 may improve the signal density of the first and second final output signals FOUT1 and FOUT2 by increasing the rising slope of the first output signal OUT1B and thus reducing the mismatch between rising timing and falling timing of the first output signal OUT1B.

Figure 5:
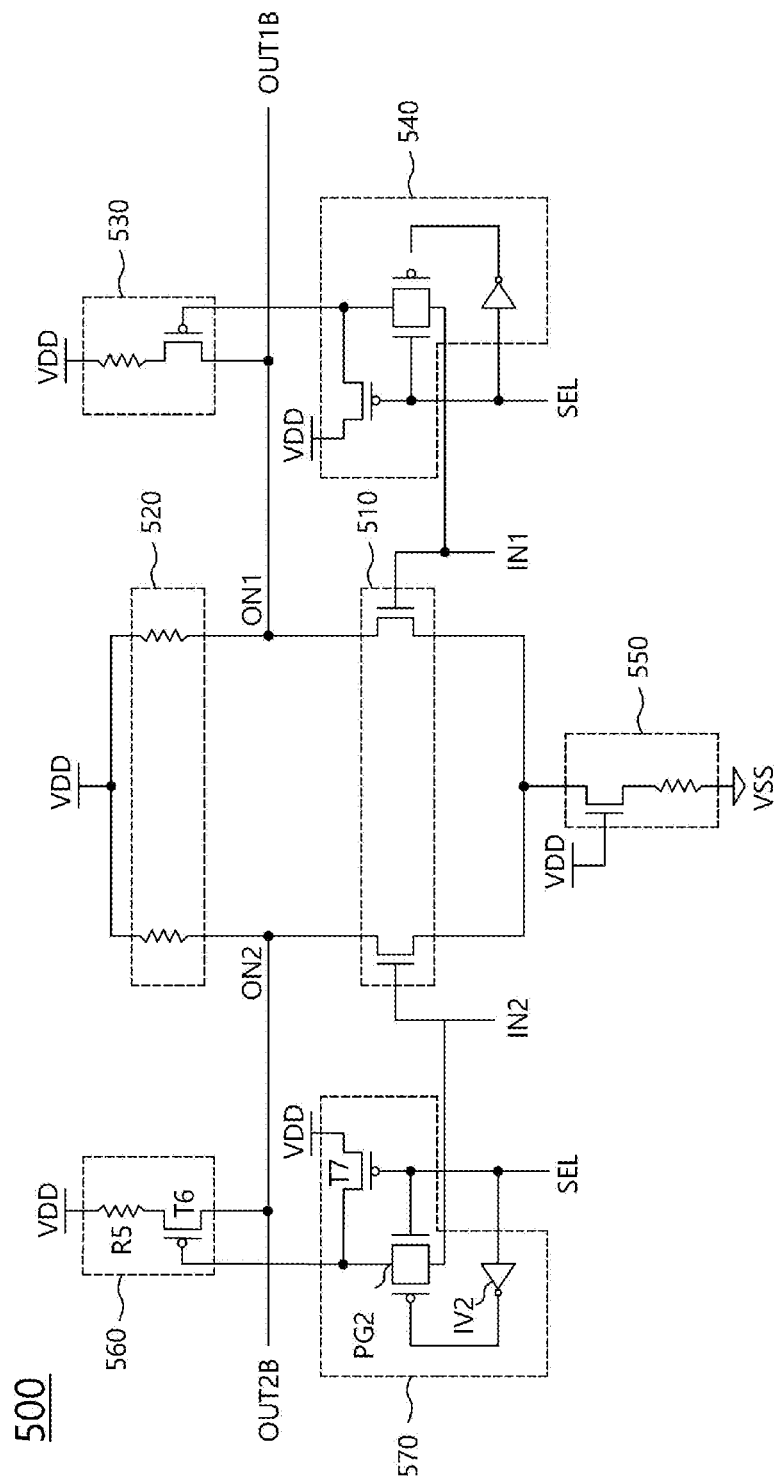
FIG. 5 is a circuit diagram illustrating a representation of an example of a buffer circuit in accordance with an embodiment.

FIG. 5 is a circuit diagram illustrating a representation of an example of a buffer circuit 500 in accordance with an embodiment. Referring to FIG. 5, the buffer circuit 500 may include an amplification circuit 510, a main load circuit 520, a first sub-load circuit 530, a first load switch circuit 540, an enablement circuit 550, a second sub-load circuit 560, and a second load switch circuit 570. The buffer circuit 500 of FIG. 5 may be the same as the buffer circuit 200 described with reference to FIGS. 2 and 3 except for the second sub-load circuit 560 and the second load switch circuit 570. FIG. 5 illustrates similar reference numbers indicating substantially the same elements as those of the buffer circuit 200 of FIG. 2. Description for substantially the same elements as those of the buffer circuit of FIGS. 2 and 3 will be omitted in the following description for the buffer circuit 500 of FIG. 5.

The second sub-load circuit 560 may further drive the second output node ON2 in response to the second input signal IN2. The second sub-load circuit 560 may change the voltage level of second output signal OUT2B according to the level of the second input signal IN2. The second input signal IN2 may be a differential signal of the first input signal IN1. The second sub-load circuit 560 may change the voltage level of the second output signal OUT2B when the second input signal IN2 has a low level. The first sub-load circuit 530 may provide the power supply voltage VDD to the first output node ON1 when the level of the first output signal OUT1B increases from a low level to a high level. In the similar manner, the second sub-load circuit 560 may provide the power supply voltage VDD to the second output node ON2 when the level of the second input signal IN2 decreases from a high level to a low level or when the level of the second output signal OUT2B increases from a low level to a high level. Therefore, the second sub-load circuit 560 may increase the rising slope of the second output signal OUT2B, and thus compensate the mismatch between rising timing and falling timing of the second output signal OUT2B.

The second load switch circuit 570 may deactivate the second sub-load circuit 560 in response to the selection signal SEL. The second load switch circuit 570 may activate the second sub-load circuit 560 by providing the second input signal IN2 to the second sub-load circuit 560 when the selection signal SEL is enabled. The second load switch circuit 570 may deactivate the second sub-load circuit 560 by blocking input of the second input signal IN2 to the second sub-load circuit 560 when the selection signal SEL is disabled.

The second sub-load circuit 560 may include a sixth transistor T6 and a fifth resistive element R5. The sixth transistor T6 may be a P-channel MOS transistor. The sixth transistor T6 may receive the second input signal IN2 at its gate, may be electrically coupled to the second output node ON2 at its drain, and may be electrically coupled to the fifth resistive element R5 at its source. The fifth resistive element R5 may receive the power supply voltage VDD at one end, and may be electrically coupled to the sixth transistor T6 at the other end.

The second load switch circuit 570 may include a second inverter IV2, a second pass gate PG2 and a seventh transistor T7. The second inverter IV2 may invert the selection signal SEL. The second pass gate PG2 may receive the second input signal IN2. The second pass gate PG2 may selectively transfer the second input signal IN2 to the second sub-load circuit 560 in response to the selection signal SEL and an output of the second inverter IV2 (i.e., the inverted signal of the selection signal SEL). The seventh transistor T7 may be a P-channel MOS transistor. The seventh transistor T7 may receive the selection signal SEL at its gate, may be electrically coupled to the second output node ON2 at its drain, and may receive the power supply voltage VDD at its source. The seventh transistor T7 may deactivate the second sub-load circuit 560 by providing the power supply voltage VDD to the sixth transistor T6 of the second sub-load circuit 560 when the selection signal SEL is disabled. The buffer circuit 500 may reduce mismatch between rising timing and falling timing of the first output signal OUT1B through the first sub-load circuit 530 and the first load switch circuit 540, and may reduce mismatch between rising timing and falling timing of the second output signal OUT2B through the second sub-load circuit 560 and the second load switch circuit 570.

Figure 6:
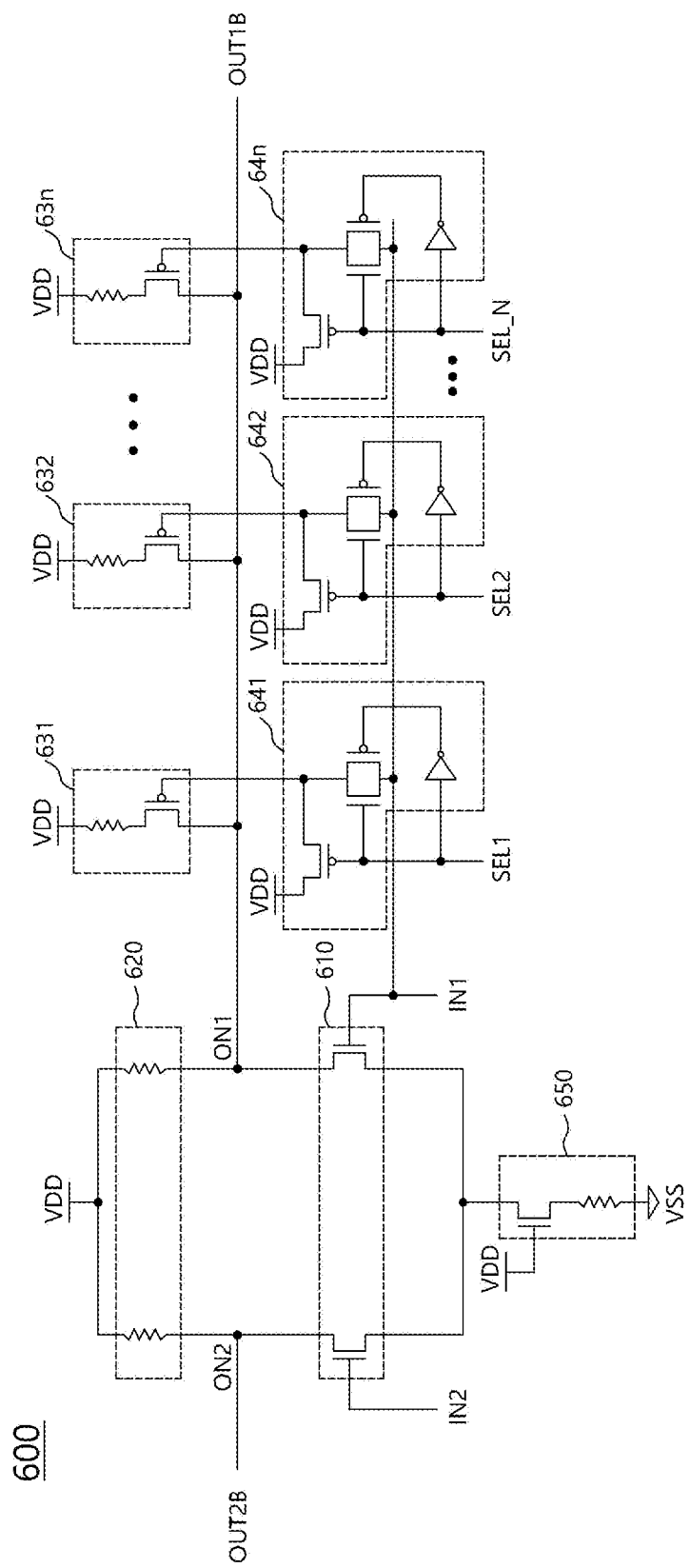
FIG. 6 is a circuit diagram illustrating a representation of an example of a buffer circuit in accordance with an embodiment.

FIG. 6 is a circuit diagram illustrating representation of an example of a buffer circuit 600 in accordance with an embodiment. Referring to FIG. 6, the buffer circuit 600 may include an amplification circuit 610, a main load circuit 620, a plurality of sub-load circuits 631 to 63n, a plurality of load switch circuits 641 to 64n, and an enablement circuit 650. The amplification circuit 610, the main load circuit 620, and the enablement circuit 650 may be the same as the amplification circuit 210, the main load circuit 220, and the enablement circuit 250 described with reference to FIGS. 2 and 3. Description for the same elements as those of the buffer circuit of FIGS. 2 and 3 will be omitted in the following description for the buffer circuit 600 of FIG. 6. The plurality of sub-load circuits 631 to 63n may provide the power supply voltage VDD to the first output node ON1 in response to a plurality of selection signals SEL1 to SELn and the first input signal IN1. Each of the plurality of sub-load circuits 631 to 63n may change the voltage level of first output signal OUT1B when the first input signal IN1 has a low level. Each of the plurality of sub-load circuits 631 to 63n may increase the rising slope of the first output signal OUT1B by further driving the first output node ON1 when the level of the first output signal OUT1B increases from a low level to a high level.

The buffer circuit 600 may change a number of operating sub-load circuits among the plurality of sub-load circuits 631 to 63n in response to the plurality of selection signals SEL1 to SELn. That is, the number of operating sub-load circuits 631 to 63n may change according to a number of enabled selection signals among the plurality of selection signals SEL1 to SELn. The buffer circuit 600 may further include the plurality of load switch circuits 641 to 64n for selectively providing the first input signal IN1 to the plurality of sub-load circuits 631 to 63n in response to the plurality of selection signals SEL1 to SELn. The plurality of load switch circuits 641 to 64n may receive the plurality of selection signals SEL1 to SELn, and may be electrically coupled to the plurality of sub-load circuits 631 to 63n, respectively. The plurality of load switch circuits 641 to 64n may activate the plurality of sub-load circuits 631 to 63n by providing the first input signal IN1 to the plurality of sub-load circuits 631 to 63n when the plurality of selection signals SEL1 to SELn are enabled, respectively. The plurality of load switch circuits 641 to 64n may deactivate the plurality of sub-load circuits 631 to 63n by blocking the input of the first input signal IN1 to the plurality of sub-load circuits 631 to 63n when the plurality of selection signals SEL1 to SELn are disabled, respectively. The plurality of sub-load circuits 631 to 63n and the plurality of load switch circuits 641 to 64n may be substantially the same as the sub-load circuit 230 and the load switch circuit 240, respectively, except for the signals provided thereto. The buffer circuit 600 may compensate mismatch between rising timing and falling timing of the first output signal OUT1B with much greater accuracy by variously changing the rising slope of the first output signal OUT1B through the plurality of sub-load circuits 631 to 63n. Therefore, the buffer circuit 600 may allow a receiver and a system including the same to precisely receive signals.

While certain embodiments have been described above, it will be understood to those skilled in the art that the embodiments described are by way of example only. Accordingly, the buffer circuit, reciever and system using the same should not be limited based on the described embodiments.

What is claimed is:

1. A buffer circuit comprising:
   an amplification circuit configured to change voltage levels of first and second output nodes according to levels of first and second input signals;
   a main load circuit configured to provide a power supply voltage to the first and second output nodes; and
   a sub-load circuit configured to provide the power supply voltage to the first output node in response to the first input signal.

2. The buffer circuit of claim 1, wherein the sub-load circuit provides the power supply voltage to the first output node when the first input signal has a low level.

3. The buffer circuit of claim 1, wherein the sub-load circuit provides the power supply voltage to the first output node when the first output signal rises from a low level to a high level.

4. The buffer circuit of claim 1, wherein the sub-load circuit steepens a rising slope of the first output signal when the first output signal rises from a low level to a high level.

5. The buffer circuit of claim 1, further comprising a load switch circuit configured to deactivate the sub-load circuit in response to a selection signal.

6. The buffer circuit of claim 5, wherein the load switch circuit deactivates the sub-load circuit by blocking input of the first input signal to the sub-load circuit when the selection signal is disabled.

7. The buffer circuit of claim 1, wherein the sub-load circuit comprises:
a resistive element having an end coupled to the power supply voltage; and
a transistor having a source coupled to the other end of the resistive element, a drain coupled to the first output node, and a gate configured to receive the first input signal.

8. The buffer circuit of claim 7, further comprising a load switch circuit coupled to the gate of the transistor and configured to selectively transfer the first input signal to the gate of the transistor in response to a selection signal.

9. A buffer circuit comprising:
an amplification circuit configured to change voltage levels of first and second output nodes according to levels of first and second input signals;
a main load circuit configured to provide a power supply voltage to the first and second output nodes;
a first sub-load circuit configured to provide the power supply voltage to the first output node in response to the first input signal; and
a second sub-load circuit configured to provide the power supply voltage to the second output node in response to the second input signal.

10. The buffer circuit of claim 9, wherein the first sub-load circuit provides the power supply voltage to the first output node when the first input signal has a low level.

11. The buffer circuit of claim 9, wherein the first sub-load circuit provides the power supply voltage to the first output node when the first output signal rises from a low level to a high level.

12. The buffer circuit of claim 9, wherein the second sub-load circuit provides the power supply voltage to the second output node when the second input signal has a low level.

13. The buffer circuit of claim 9, wherein the second sub-load circuit provides the power supply voltage to the second output node when the second output signal rises from a low level to a high level.

14. The buffer circuit of claim 9, further comprising:
a first load switch circuit configured to deactivate the first sub-load circuit in response to a selection signal; and
a second load switch circuit configured to deactivate the second sub-load circuit in response to the selection signal.

15. A buffer circuit comprising:
an amplification circuit configured to change voltage levels of first and second output nodes according to levels of first and second input signals;
a main load circuit configured to provide a power supply voltage to the first and second output nodes; and
a plurality of sub-load circuits configured to provide the power supply voltage to the first output node based on a plurality of selection signals and the first input signal.

16. The buffer circuit of claim 15, wherein a number of operating sub-load circuits among the plurality of sub-load circuits changes according to the plurality of selection signals.

17. The buffer circuit of claim 15, wherein each of the plurality of sub-load circuits provides the power supply voltage to the first output node when the first input signal has a low level.

18. The buffer circuit of claim 15, wherein each of the plurality of sub-load circuits provides the power supply voltage to the first output node when the first output signal rises from a low level to a high level.

19. The buffer circuit of claim 15, further comprising a plurality of load switch circuits configured to selectively provide the first input signal to the plurality of sub-load circuits according to the plurality of selection signals, respectively.

20. The buffer circuit of claim 15, wherein each sub-load circuit comprises:
a resistive element having an end coupled to the power supply voltage; and
a transistor having a source coupled to the other end of the resistive element, a drain coupled to the first output node, and a gate configured to receive the first input signal.

* * * * *